(12) United States Patent
Lin et al.

(10) Patent No.: US 7,787,977 B2
(45) Date of Patent: Aug. 31, 2010

(54) METHODS AND SYSTEMS FOR FORMING SEMICONDUCTOR STRUCTURES

(75) Inventors: Chien-Hsun Lin, Hsinchu (TW); An-Kuo Yang, Hsinchu (TW); Yao-Wen Guo, Chaozhou Town (TW); Chun-Hung Lin, Taoyuan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 879 days.

(21) Appl. No.: 11/563,947

(22) Filed: Nov. 28, 2006

(65) Prior Publication Data

US 2008/0125902 A1      May 29, 2008

(51) Int. Cl.
*G06F 19/00* (2006.01)
(52) U.S. Cl. .................. 700/100; 700/121
(58) Field of Classification Search ............ 700/100, 700/121
See application file for complete search history.

(56) References Cited

U.S. PATENT DOCUMENTS 6,768,930 B2 * 7/2004 Oh ............................ 700/217
7,068,351 B2 * 6/2006 Van Den Nieuwelaar et al. ........................... 355/53
7,522,968 B2 * 4/2009 Hongkham et al. ......... 700/100

OTHER PUBLICATIONS

"Tips on Managing Bottlenecks", Thomas D. McBride, Partners for Creative Solutions, Inc. Summer 2002—vol. 12, No. 3.*
S. Jain B. Gan, C. Lim, and Y. Low, "Bottleneck based modeling of semiconductor supply chains", Proceedings of the MASM 2000 Conference, pp. 340-345.*

* cited by examiner

*Primary Examiner*—Michael D Masinick
(74) *Attorney, Agent, or Firm*—Duane Morris LLP

(57)      ABSTRACT

A method for processing substrates to manufacture semiconductor structures thereon includes analyzing at least one first processing parameter of a first apparatus for processing a substrate, thereby yielding at least one first throughput rate of the first apparatus. At least one second processing parameter of a second apparatus is analyzed for processing the substrate, thereby yielding at least one second throughput rate of the second apparatus. The first throughput rate and the second throughput rate are compared, thereby yielding at least one comparison result for processing the substrate.

14 Claims, 6 Drawing Sheets

METHODS AND SYSTEMS FOR FORMING SEMICONDUCTOR STRUCTURES

BACKGROUND OF THE INVENTION

1. Field of the Invention

The present invention relates to methods and systems for forming semiconductor structures, and more particularly to methods for forming a photolithographic layer and systems for forming the photolithographic layer.

2. Description of the Related Art

With advances associated with electronic products, semiconductor technology has been widely applied in manufacturing memories, central processing units (CPUs), liquid crystal displays (LCDs), light emission diodes (LEDs), laser diodes and other devices or chipsets. In order to achieve high-integration and high-speed goals, dimensions of semiconductor integrated circuits continue to shrink. Various materials and techniques have been proposed to achieve these integration and speed goals and to overcome manufacturing obstacles associated therewith. In addition, throughput of semiconductor manufacturing has also been studied for improving mass-production of integrated circuits.

FIG. 1 is a block diagram showing a prior art photolithographic system.

Referring to FIG. 1, a photolithographic system 100 includes a track 110 and a scanner 120, which are separate. The track 100 is configured to form a photoresist layer (not shown) over a substrate (not shown). After the coating of the photoresist layer over the substrate, the substrate is transferred to and subjected to an exposure step in the scanner 120 as indicated by arrow 115. After the exposure step, the substrate is transferred back to the track 110 for developing as indicated by arrow 125. The track 110 and the scanner 120 have individual, different throughput rates. Accordingly, the track 110 is running while the scanner is idle, vice versa. The idle track 110 or scanner 120 adversely affects the overall efficiency of the production area.

Based on the forgoing, it can be seen that improved methods and systems for transporting and processing semiconductor substrates are desired.

SUMMARY OF THE INVENTION

One aspect of the invention provides a method for processing substrates to manufacture semiconductor structures thereon. The method includes analyzing at least one first processing parameter of a first apparatus for processing a substrate, thereby yielding at least one first throughput rate of the first apparatus. At least one second processing parameter of a second apparatus is analyzed for processing the substrate, thereby yielding at least one second throughput rate of the second apparatus. The first throughput rate and the second throughput rate are compared, thereby yielding at least one comparison result for processing the substrate.

Another aspect provides a system for processing substrates to form semiconductor structures thereon and includes a first apparatus, a second apparatus and a processor coupled to the first and second apparatuses. The first apparatus is configured to process a substrate with at least one first processing parameter. The second apparatus is configured to process the substrate with at least one second processing parameter. The processor is configured to analyze the first processing parameter, thereby yielding at least one first throughput rate of the first apparatus; to analyze the second processing parameter, thereby yielding at least one second throughput rate of the second apparatus; and to compare the first throughput rate and the second throughput rate, thereby yielding at least one comparison result for processing the substrate.

The above and other aspects of the present invention will be better understood from the following detailed description of exemplary embodiments of the invention that is provided in connection with the accompanying drawings.

BRIEF DESCRIPTION OF THE DRAWINGS

Following are brief descriptions of exemplary drawings. They are mere exemplary embodiments and the scope of the present invention should not be limited thereto. It is emphasized that, according to common practice, the various features of the drawings are not necessarily to scale. On the contrary, the dimensions of the various features may be arbitrarily expanded or reduced for clarity. Like numerals denote like features throughout the specification and drawing.

DESCRIPTION OF THE PREFERRED EMBODIMENT

Figure 1:
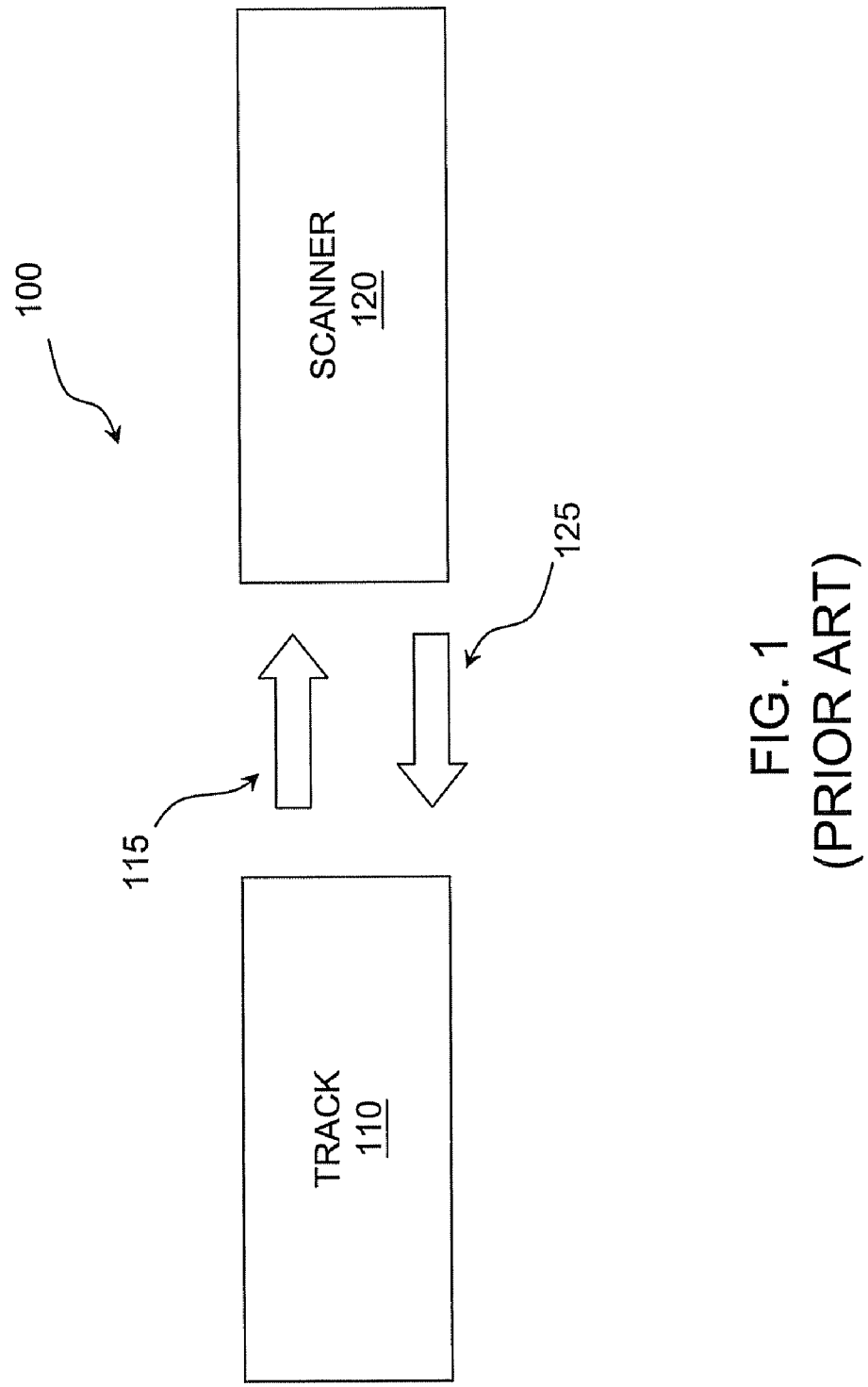
FIG. 1 is a block diagram showing a prior art photolithographic system.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Figure 2:
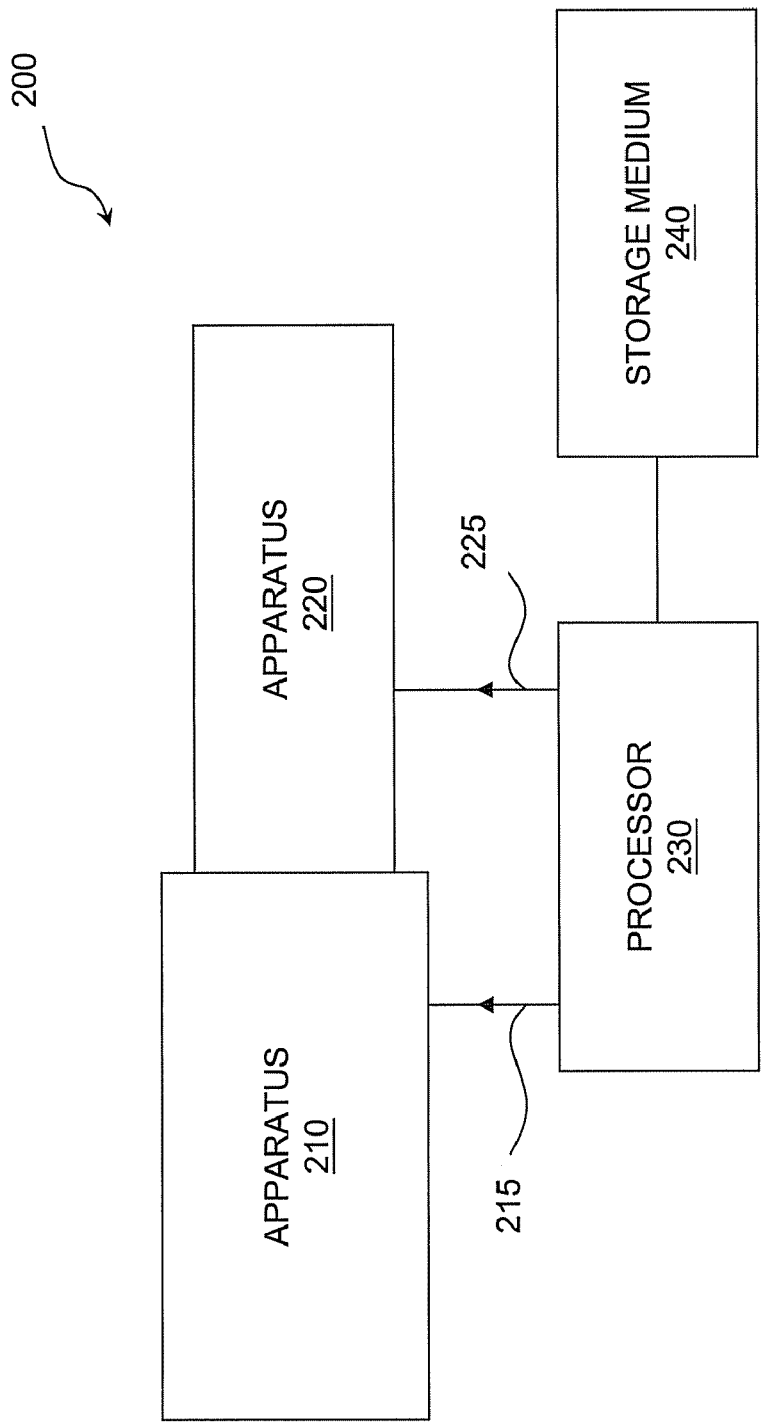
FIG. 2 is a schematic block diagram showing an exemplary system for processing semiconductor substrates.

FIG. 2 is a schematic block diagram showing an exemplary system for forming semiconductor structures.

In some exemplary embodiments, the system 200 may comprise, for example, apparatuses 210, 220 and a processor 230 coupled to the apparatuses 210, 220. The apparatus 210 can be, for example, a track, a photoresist coater, a thin film deposition apparatus (e.g., a chemical vapor deposition (CVD) apparatus, a physical vapor deposition (PVD) apparatus, a furnace or the like), an etcher, an implanter, a measurement apparatus (e.g., a thickness measurement apparatus, a critical dimension (CD) measurement apparatus, a scanning electron microscope (SEM), a depth measurement apparatus or the like), a wafer acceptance test (WAT) apparatus, a metrology apparatus or other apparatus related to semiconductor manufacturing. The apparatus 220 can be, for example, a scanner, a stepper, a photolithographic exposure apparatus, a thin film deposition apparatus (e.g., a chemical vapor deposition (CVD) apparatus, a physical vapor deposition (PVD) apparatus, a furnace or the like), an etcher, an implanter, a measurement apparatus (e.g., a thickness measurement apparatus, a critical dimension (CD) measurement apparatus, a scanning electron microscope (SEM), a depth measurement apparatus or the like), a wafer acceptance test (WAT) apparatus, a metrology apparatus or other apparatus related to semiconductor manufacturing. Alternatively, apparatuses 210, 220 may be described as substrate or wafer processing tools or systems. The processor 230 may comprise, for example, at least one of a digital signal processor (DSP), microprocessor, computer, or the like, or combinations thereof.

In some embodiments, the apparatus 210 is a track and the apparatus 220 is a scanner. The apparatus 210 may be coupled to the apparatus 220. In some embodiments, the apparatus 210 is physically connected with the apparatus 220 such that substrates can be in-line processed by the apparatuses 210 and 220. For example, the track 210 is connected with the scanner 220, in which substrates (not shown) are subjected to a photoresist coating process and then a photolithographic exposure process, respectively, without being moved out from the system 200. In other embodiments, the apparatus 210 is separated from the apparatus 220.

The apparatus 210 is configured to process a substrate in accordance with at least one associated processing parameter. The substrate (not shown) can be a silicon substrate, III-V compound substrate, display substrate such as a liquid crystal display (LCD), plasma display, electro luminescence (EL) lamp display, or light emitting diode (LED) substrate, for example. The processing parameter may be at least one of a processing time for forming an adhesive layer over the substrate, a processing time for forming a photoresist layer over the substrate, a processing time for cooling the substrate, a processing time for baking the substrate and, a processing time for developing a photoresist layer formed over the substrate, but the processing parameters may be other processing times related to forming a semiconductor structure in other exemplary embodiments.

The apparatus 220 is configured to process the substrate in accordance with at least one associated processing parameter. The processing parameter of the apparatus 220 may comprise at least one of, for example, a range of overlay such as a tolerance value, a range of focus, a range of energy, other processing parameters that are related to forming a semiconductor structure and processing times that are related to forming a semiconductor structure and processing semiconductor substrates. Focus may be used to designate depth of focus, stage height, or similar parameters associated with focus.

The processor 230 is configured to analyze the processing parameter or parameters of the apparatus 210, thereby yielding at least one throughput rate (R1) of the apparatus 210; to analyze the processing parameter or parameters of the apparatus 220, thereby yielding at least one throughput rate (R2) of the apparatus 220; and to compare the throughput rate (R1) and the second throughput rate (R2), thereby yielding at least one comparison result 215, and/or 225 used for processing the substrate. Detailed descriptions of the steps are set forth below.

In some exemplary embodiments, the system 200 further comprises a storage medium 240 coupled to the processor 230. The storage medium 240 may comprise, for example, at least one of a random access memory (RAM), floppy diskettes, read only memories (ROMs), flash drive, CD-ROMs, DVD-ROMs, hard drives, high density (e.g., "ZIP™") removable disks or any other computer-readable storage medium. The storage medium 240 is configured to store at least one of the processing parameter of the apparatus 210, the throughput rate (Ri), the processing parameter of the apparatus 220, the throughput rate (R2), the comparison results 215 and/or 225, and at least one table including the processing parameters of the apparatus 210 and/or the apparatus 220 corresponding to scan speeds or the like.

In still other embodiments, the present invention may be embodied in the form of computer-implemented processes and apparatus for practicing those processes. The present invention may also be embodied in the form of computer program code embodied in tangible media, such as floppy diskettes, read only memories (ROMs), CD-ROMs, hard drives, "ZIP™" high density disk drives, flash memory drives, or any other computer-readable storage medium, wherein, when the computer program code is loaded into and executed by a computer, the computer becomes an apparatus for practicing the invention. The present invention may also be embodied in the form of computer program code, for example, whether stored in a storage medium, loaded into and/or executed by a computer, or transmitted over a suitable transmission medium, such as over the electrical wiring or cabling, through fiber optics, or via electromagnetic radiation, wherein, when the computer program code is loaded into and executed by a computer, the computer becomes an apparatus for practicing the invention. When implemented on a general-purpose processor, the computer program code segments configure the processor to create specific logic circuits.

Figure 3:
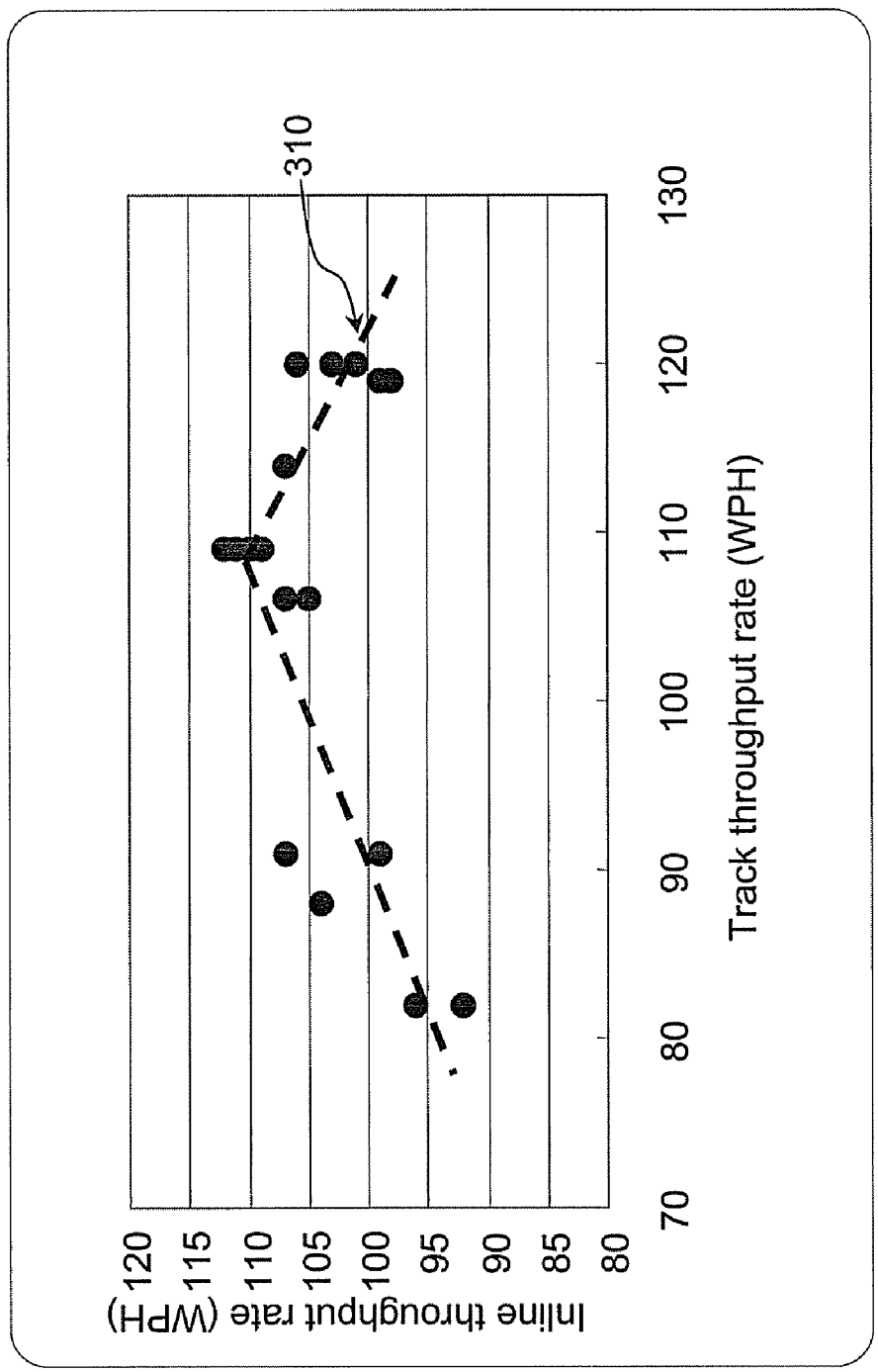
FIG. 3 is a schematic drawing showing a relation between a track throughput rate and an inline throughput rate of an exemplary system.

FIG. 3 is a schematic drawing showing a relation between a track throughput rate and an inline throughput rate for an exemplary system.

As described above, in some exemplary systems 200, the apparatus 210, e.g., a track, is physically connected with the apparatus 220, e.g., a scanner, such that substrates can be processed in the system 200 without exiting the system. Referring to FIG. 3, the horizontal axis represents a track throughput rate of the track 210 in units of wafer per hour (WPH), and the vertical axis represents an inline throughput rate of the system 200 in units of WPH. In the exemplary system 200, the scan speed or throughput rate of the scanner, i.e. apparatus 220, is kept as a constant. As shown in FIG. 3, the inline throughput rate of the system 200 gradually increases with an increase in track throughput. After the track throughput rate reaches about 110 WPH, the inline throughput rate of the system 200 gradually declines with an increase in track throughput. As indicated by the doted line 310, the inline throughput rate of the system 200 reaches a maximum rate when the inline throughput rate of the system 200 is substantially equal to the track throughput rate at about 110 WPH. In other words, the maximum inline throughput rate of the system 200 is reached when the throughput rate of the scanner, i.e. apparatus 220 is substantially equal to, or larger than, the throughput rate of the track 210. However, if the throughput rate of the scanner, i.e., apparatus 220 is substantially larger than the track throughput rate, the scanner, i.e., apparatus 220 may become idle when no substrate can be provided by the track 210. Further, the high throughput of the scanner, i.e. apparatus 220 may adversely affect exposure qualities of the scanner. Accordingly, the desired efficiency of the system 200 can be reached, if the track throughput rate is substantially equal to the throughput rate of the scanner, i.e. apparatus 220.

It is noted that the present invention is not limited the exemplary embodiments described in FIG. 3. In some embodiments, the desired efficiency of the system 200 can be achieved, if the throughput rates of the apparatuses 210 and 220 are different.

Figure 4A:
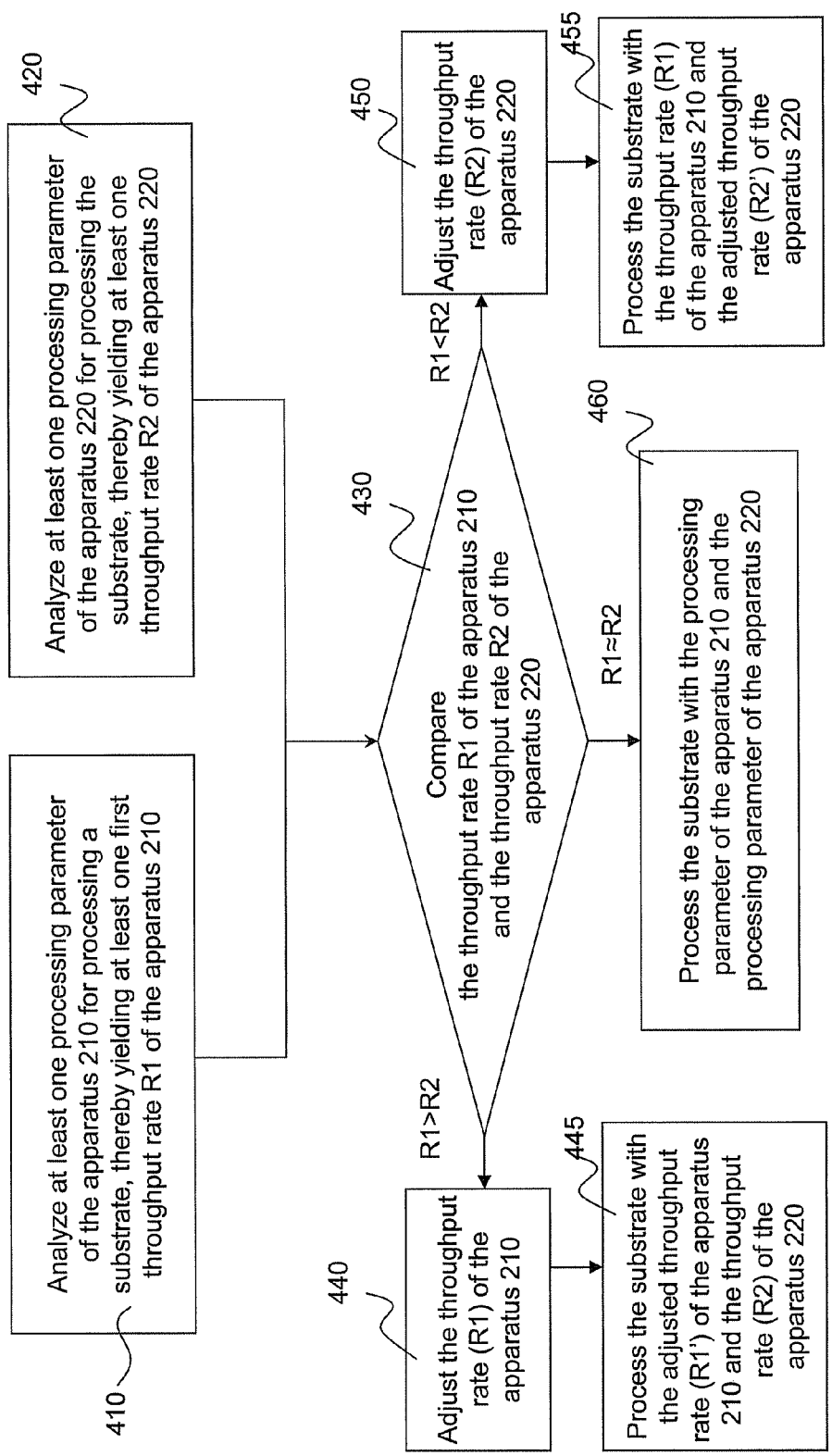
FIG. 4A is a schematic flowchart showing an exemplary method for processing semiconductor substrates.

FIG. 4A is a schematic flowchart showing an exemplary method for forming semiconductor structures by processing substrates.

Referring to FIG. 4A, step 410 analyzes the processing parameter of the apparatus 210 for processing the substrate, thereby yielding at least one throughput rate R1 of the apparatus 210. Step 410 may be performed by the processor 230 set forth above in connection with FIG. 2. The processing parameters may be similar to, or as same as, the processing parameters of the apparatus 210 set forth above in connection with FIG. 2.

In some exemplary embodiments using the track 210 and the scanner 220 for performing a photolithographic process, exemplary steps of the photolithographic process are presented in Table I as shown below:

TABLE I

| Step No. | Unit | Recipe |
|---|---|---|
| 1 | ADH | A1 |
| 2 | CPL | C1 |
| 3 | COT | CO1 |
| 4 | HP | H1 |
| 5 | CPL | C2 |
| 6 | Scanner 220 | Scanner Job |
| 7 | HP | H2 |
| 8 | CPL | C3 |
| 9 | DEV | DE1 |
| 10 | HP | H3 |
| 11 | CPL | C4 |

Step 6 is performed in the scanner 220, and steps 1-5 and 7-11 are performed in the track 210. In Table I, ADH represents an adhesive layer coater; CPL represents a cooling plate; COT represents a photoresist layer coater; HP represents a hot baking plate; and DEV represents a developer. A1, C1, CO1, H1, C2, H2, C3, DE1, H3 and C0 are recipe names corresponding to various steps included in the photolithographic process. Each of these recipes A1, C1, CO1, H1, C2, H2, C3, DE1, H3 and C0 may include at least one processing parameter, e.g., processing time, temperature, pressure, spin speed, or other parameter that is related to a photolithographic process. For example, the processing parameter may include a processing time for forming an adhesive layer over the substrate ($t_{A1}$), processing time for cooling the substrate ($t_{C1}$, $t_{C2}$, $t_{C3}$, $t_{C4}$), a processing time for forming a photoresist layer ($t_{CO1}$), processing times for baking the substrate($t_{H1}$, $t_{H2}$, $t_{H3}$), and a processing time for developing the photoresist layer ($t_{DE1}$).

Figure 4B:
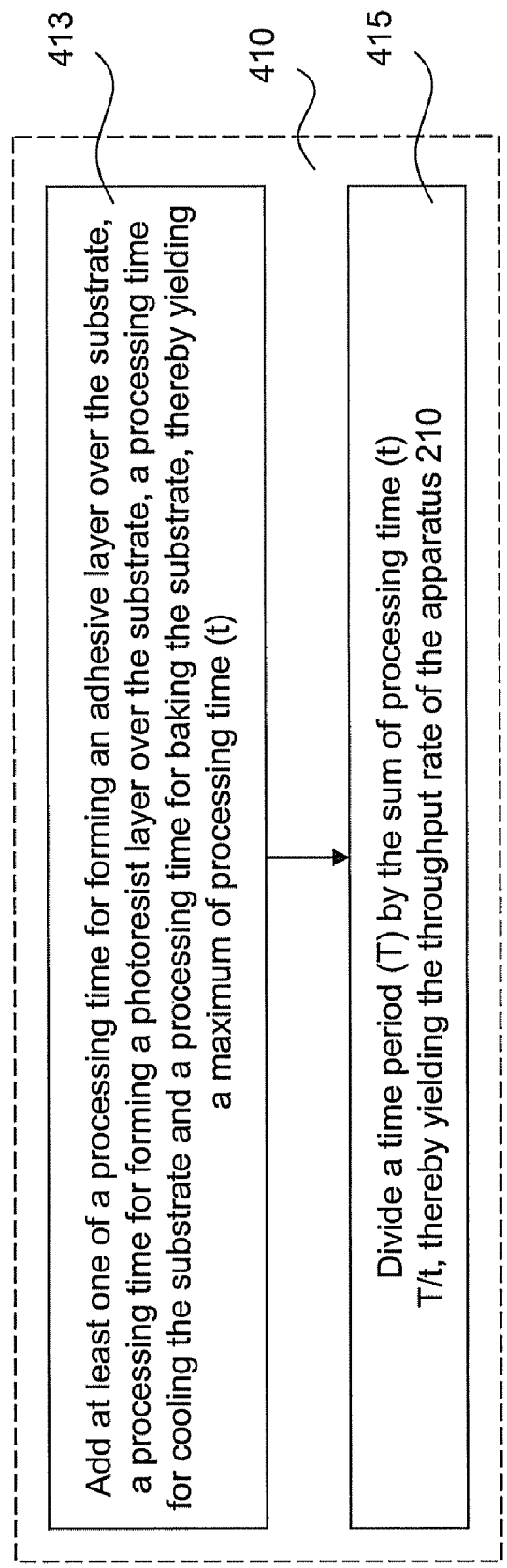
FIG. 4B is a schematic flow chart showing further details of one of the steps shown in FIG. 4A.

FIG. 4B is a schematic flow chart of step 410 set forth above in connection with FIG. 4A.

Referring to FIG. 4B, step 410 may include, for example, steps 413 and 415. Step 413 adds at least one of the processing time for forming an adhesive layer over the substrate ($t_{A1}$), the unit number for forming adhesive layer over the substrate ($n_{A1}$), the processing time for cooling the substrate ($t_{C1}$, $t_{C2}$, $t_{C3}$ and $t_{C4}$), the unit number for cooling the substrate ($n_{C1}$, $n_{C2}$, $n_{C3}$ and $n_{C4}$), the processing time for forming a photoresist layer ($t_{CO1}$), the unit number for forming a photoresist layer ($n_{CO1}$), the processing times for baking the substrate ($t_{H1}$, $t_{H2}$ and $t_{H3}$), the unit number for baking the substrate ($n_{H1}$, $n_{H2}$ and $n_{H3}$), the processing time for developing the photoresist layer ($t_{DE1}$) and the unit number for developing the photoresist layer ($n_{DE1}$), thereby yielding a maximum processing time (t). For example, the maximum processing time (t) can be obtained in accordance with formula (1) as set forth below:

$$\text{Processing time } (t) = \text{MAX}(t_{A1}/n_{A1}, t_{C1}/n_{C1}, t_{C2}/n_{C2}, t_{C3}/n_{C3}, t_{C4}/n_{C4}, T_{CO1}/n_{CO1}, t_{H1}/n_{H1}, t_{H2}/n_{H2}, t_{H3}/n_{H3}, t_{DE1}/n_{DE1}) \quad (1)$$

It is noted that the maximum processing time (t) of the track 210 varies with the number of steps included in the photolithographic process.

Step 415 divides a time period (T) by the maximum processing time (t), i.e., T/t, thereby yielding the throughput rate (R1) of the track 210. According to the exemplary embodiment in which the unit of the maximum processing time (t) is seconds, the throughput rate (R1) of the track 210 in WPH (Wafers Per Hour), i.e., T=3,600 seconds, may be expressed by 3,600/t (WPH).

Referring again to FIG. 4A, step 420 analyzes the processing parameter of the apparatus 220 for processing the substrate, thereby yielding at least one throughput rate (R2) of the apparatus 220. Step 420 may be performed by the processor 230 set forth above in connection with FIG. 2. The processing parameters are similar to, or as same as, the processing parameters of the apparatus 220 set forth above in connection with FIG. 2.

In some exemplary embodiments using the scanner 220 for exposing a photoresist layer formed over a substrate, the storage medium 240 shown in FIG. 2A may comprise, for example, a scanner job in Table II described below.

TABLE II

| Layer | Desired image quality | Range of overlay | Range of focus | Range of Energy |
|---|---|---|---|---|
| A11 | B1 | XY1 | Z1 | E1 |
| A11 | B2 | XY3 | Z5 | E3 |
| A12 | B1 | XY1 | Z1 | E1 |
| A12 | B2 | XY1 | Z1 | E1 |
| A12 | B3 | XY5 | Z5 | E5 |
| A12 | B4 | XY5 | Z5 | E5 |
| A13 | B1 | XY5 | Z5 | E3 |

A11, A12, A13 represent various photolithographic layers for defining patterns over the substrate, such as poly layer, contact layer, via layer, metal layer and the like. B1, B2, B3 and B4 represent desired image quality at different areas of a substrate. For example, a high image quality B2 is desired at the central area of the substrate and a low image quality B1 is desired at the peripheral area of the substrate. According to the pre-defined layers and image qualities, corresponding, desired ranges of overlay, focus and exposure energy can also be defined. The ranges may be defined by percentages (%) by dividing deviations from pre-defined values with the pre-defined values.

XY1, XY3 and XY5 represent desired ranges of overlay of the scanner 220; Z1 and Z5 represent desired ranges of focus of the scanner 220; and E1, E3 and E5 represent desired ranges of exposure energy of the scanner 220. For example, in order to pattern the photolithographic layer A11 with the desired image quality B1 at the peripheral area of the substrate, the desired range of overlay is XY1, the desired range of focus is Z1 and the desired range of exposure energy is E1. By adjusting variations of overlay, focus, energy within the respective ranges, a desired image quality B1 of the photolithographic layer A11 can be achieved.

Associated with the various ranges of overlay, focus and exposure energy of the scanner 220 are scan speeds required to provide the desired image quality of the photolithographic layer. The desired ranges of the overlay, focus and exposure, and corresponding scan speeds are shown in Tables III-V below.

TABLE III

| Range of overlay | Scan speed |
| --- | --- |
| XY1 | S11 |
| XY2 | S12 |
| XY3 | S13 |
| XY4 | S14 |
| XY5 | S15 |
| XY6 | S16 |

TABLE IV

| Range of focus | Scan speed |
| --- | --- |
| Z1 | S21 |
| Z2 | S22 |
| Z3 | S23 |
| Z4 | S24 |
| Z5 | S25 |
| Z6 | S26 |

TABLE V

| Range of exposure energy | Scan speed |
| --- | --- |
| E1 | S31 |
| E2 | S32 |
| E3 | S33 |
| E4 | S34 |
| E5 | S35 |
| E6 | S36 |

In Tables III-V, the scan speeds S11-S16, S21-S26 and S31-S36 represent maximum levels of scan speeds of the scanner 220 that can be used to provide the desired ranges of various overlay, focus and exposure energy. The scan speeds may therefore be controlled to be substantially equal to, or less than, the maximum levels in conjunction with the variour ranges of overlay, focus and exposure energy that may be used.

Figure 4C:
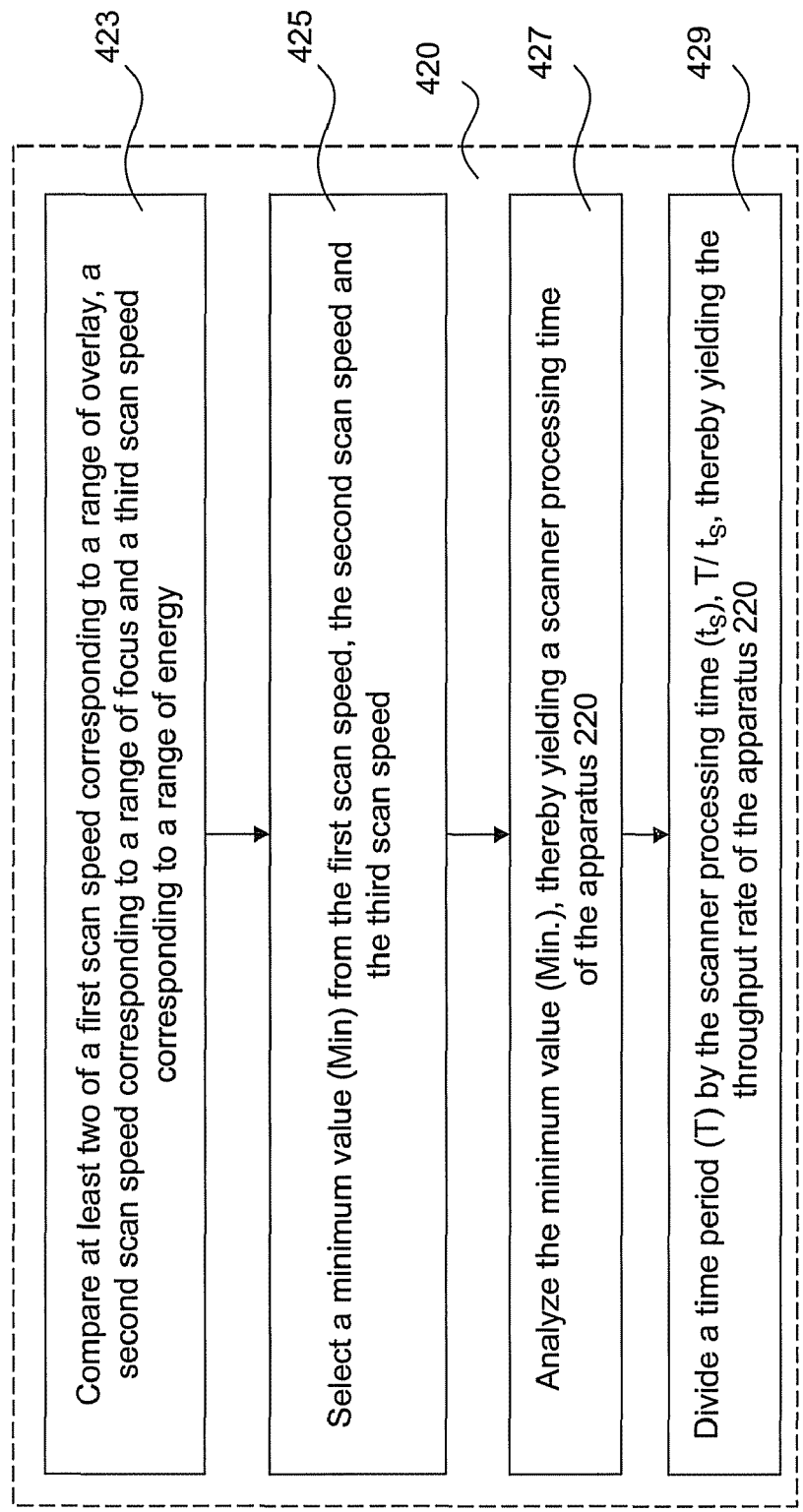
FIG. 4C is a schematic flow chart showing further details of one of the steps shown in FIG. 4A.

FIG. 4C is a schematic flow chart of step 420 set forth above in connection with FIG. 4A.

Referring to FIG. 4C, step 420 may include, for example, steps 423, 425, 427 and 429. Step 423 may compare at least two of a scan speed corresponding to a range of overlay, a scan speed corresponding to a range of focus and a scan speed corresponding to a range of exposure energy. For example, the desired ranges of overlay, focus and exposure energy are XY1, Z1 and E1, respectively. Based on Tables III-V, the corresponding scan speeds are S11, S21 and S31. Accordingly, step 423 compares the scan speeds S11, S21 and S31.

Still referring to FIG. 4C, the processor 230 shown in FIG. 2 then performs step 425, selecting a minimum value (Min.) from the scan speeds S11, S21 and S31. For example, the minimum value (Min.), e.g., S11, is selected such that variations of overlay, focus and exposure energy will fall within the ranges of overlay, focus and exposure energy, respectively, and the desired image quality of the photolithographic layer can be produced.

The processor 230 shown in FIG. 2 performs step 427, analyzing the minimum value (Min.), thereby yielding a processing time ($t_s$) of the apparatus 220. The processing time ($t_s$) of the apparatus 220 represents a time associated with a scan speed and during which the apparatus 220 completes processing the substrate. In some embodiments, step 427 analyzes the minimum value (Min.) in accordance with formula (2) set forth below:

$$\text{Processing time } (ts) = (((((F/\text{Min.}) + t_p)N_f + c)N_w) + t_h)/N_w \quad (2)$$

In formula (2), F represents the Y-axis dimension of a field size (mm); $t_p$ represents a preparing time(s), e.g., a time for measuring an acceleration and/or deceleration of a motor for transferring the scanner 220; $N_f$ represents the field number, e.g., a number of dies to be formed over the substrate; c represents a constant, e.g., a time for preparing a robot; $N_w$ represents a number of wafers; and th represents a time between unloading a lot of substrates and loading another lot of substrates.

The unit of the processing time ($t_s$) may be seconds. The processor 230 shown in FIG. 2 performs step 429, dividing a time period (T) by the processing time ($t_s$), i.e., $T/t_s$, thereby yielding the throughput rate (R2) of the apparatus 220. For example, the unit of the processing time ($t_s$) is second. The throughput rate (R2) of the scanner 220 is $3,600/t_s$ (WPH) when ts in seconds. It is noted that step 427 of analyzing the minimum value (Min.) is related to the formula providing the relation between the processing time ($t_s$) and the minimum value (Min.), which is a scan speed. One of ordinary skill in the art can obtain a processing time (ts) according to a desired formula.

In some other embodiments using a stepper as the apparatus 220 shown in FIG. 2, the processing time ($t_s$) of the stepper 220 may be achieved by any formula or step providing a relation between a processing speed of the stepper 220 and a processing time of the stepper 220.

Referring again to FIG. 4A, the processor 230 shown in FIG. 2 may perform step 430, comparing the throughput rate (R1) of the apparatus 210 and the throughput rate (R2) of the apparatus 220, thereby yielding at least one comparison result 215 and/or 225 for adjusting at least one value of the processing parameter of the first apparatus 210 and the processing parameter of the second apparatus 220 for processing the substrate. In some embodiments, if the throughput rate (R1) of the apparatus 210 is substantially different from the throughput rate (R2) of the apparatus 220, the processor 230 shown in FIG. 2 may communicate with the appropriate apparatuses 210, 220 to adjust at least one of the throughput rates R1 and R2; and if the throughput rate R1 is substantially equal to the throughput rate R2, the apparatuses 210 and 220 process the substrate with the original processing parameter values of the apparatus 210 and the processing parameter values of the apparatus 220. In other words, the apparatuses 210 and 220 process the substrate based on an analysis of processing time (t) and the processing time (ts) set forth above in connection with FIGS. 4B and 4C.

For example, if the throughput rate (R1) of the apparatus 210 is substantially equal to the throughput rate (R2) of the apparatus 220 as set forth above in connection with FIG. 3, step 460 processes the substrate with the original processing parameter values of the apparatuses 210 and 220 without adjusting the original processing parameter values of the apparatuses 210 and 220.

In other embodiments, if the throughput rate (R1) of the apparatus 210 is substantially larger than the throughput rate (R2) of the apparatus 220, step 440 adjusts the throughput rate (R1) of the apparatus 210 for processing the substrate. For example, step 440 may adjust a processing time of the apparatus 210 for processing the substrate. The adjustment of processing time of the apparatus 210 may include, for example, at least one of adjusting a processing time for forming an adhesive layer over the substrate, a processing time for cooling the substrate, a processing time for forming a photoresist layer over the substrate, a processing time for baking the substrate, a processing time for developing the substrate and other processing time related to a semiconductor process set forth above in connection with FIG. 4B. In some embodiments, the processing time of the apparatus 210 is increased for providing the quality of critical factors such as the photoresist layer formed over the substrate will not be adversely affected. For example, if the throughput rate (R1) of the apparatus 210 is substantially larger than the throughput rate (R2) of the apparatus 220, step 440 may increase the time C4 for cooling the substrate (shown in FIG. 4B) by Δt. By increasing the cooling time (C4+Δt), the throughput rate (R1) is reduced to R1' such that the throughput rate (R1') of the apparatus 210 is substantially equal to the throughput rate (R2) of the apparatus 220. In some embodiments, Δt can be obtained in accordance with formula (3) set forth below:

$$\Delta t = \text{processing time } (ts) \text{ of the apparatus } 220 - (OHT + CT)/CTN) \quad (3)$$

Wherein OHT represents an over head time of a cooling plate such as a time for transferring the substrate; CT represents a processing time of a cooling pate, i.e., 30 seconds; and CTN represents the number of cooling plate included in the apparatus 210. It is noted that the OHT may vary with the type of the apparatus 210. One of ordinary skill in the art can readily obtain a desired processing time based on the type of the used apparatus 210.

Step 445 then processes the substrate with the adjusted throughput rate (R1') of the apparatus 210 and the throughput rate (R2) of the apparatus 220. Since the adjusted throughput rate (R1') of the apparatus 210 is substantially equal to the throughput rate (R2) of the apparatus 220, a desired efficiency of the system 200 can be achieved as set forth above in connection with FIG. 3.

In still other embodiments, if the throughput rate (R2) of the apparatus 220 is substantially larger than the throughput rate (R1) of the apparatus 210, step 450 may adjust the throughput rate (R2) of the apparatus 210 to R2'. For example, step 450 may increase the processing time (ts) of the apparatus 220 for processing the substrate. In response to the adjustment of the processing time (ts) of the apparatus 220, the scan speed, e.g., the minimum value (Min.) of the apparatus 220 may be reduced, for example. As set forth above in connection with FIG. 4C, the minimum scan speed value (Min.) of the apparatus 220 is selected such that the variations of the overlay, focus and energy of the apparatus 220 will fall within the desired ranges. Accordingly, the reduced scan speed which is slower than the minimum value (Min.) can also provide variations of the overlay, focus and exposure energy of the apparatus 220 falling within the desired ranges.

Step 455 then processes the substrate with the throughput rate (R1) of the apparatus 210 and the adjusted throughput rate (R2') of the apparatus 220. Since the throughput rate (R1) of the apparatus 210 is substantially equal to the adjusted throughput rate (R2') of the apparatus 220, a desired efficiency of the system 200 can be achieved as set forth above in connection with FIG. 3.

In some embodiments, if the throughput rate (R1) of the apparatus 210 is faster than the throughput rate (R2) of the apparatus 220, the throughput rate (R2) of the apparatus 220 may be increased to R2' such that the throughput rate (R1) of the apparatus 210 is substantially equal to the throughput rate (R2') of the apparatus 220, if the increased throughput rate (R2') can provide a desired semiconductor structure. In other embodiments, if the throughput rate (R2) of the apparatus 220 is faster than the throughput rate (R1) of the apparatus 210, the throughput rate (R1) of the apparatus 210 may be increased to R1' such that the throughput rate (R2) of the apparatus 220 is substantially equal to the throughput rate (R1') of the apparatus 210, if the increased throughput rate (R1') can provide a desired semiconductor structure. In still other embodiments, if the throughput rates R1, R2 are different, the processor 230 shown in FIG. 2B may adjust each of the throughput rates R1' and R2' such that the adjusted throughput rate (R1') of the apparatus 210 is substantially equal to the throughput rate (R2') of the apparatus 220, provided that each of the adjusted throughput rates R1' and R2' can provide desired semiconductor structures.

Although the present invention has been described in terms of exemplary embodiments, it is not limited thereto. Rather, the appended claims should be construed broadly to include other variants and embodiments of the invention which may be made by those skilled in the field of this art without departing from the scope and range of equivalents of the invention.

What is claimed is:

1. A method for processing substrates to manufacture semiconductor structures thereon, comprising:

analyzing at least one first processing parameter of a track for processing a substrate, thereby yielding at least one first throughput rate of the track, wherein the first processing parameter comprises at least one of a processing time for forming an adhesive layer over the substrate, a processing time for forming a photoresist layer over the substrate, a processing time for cooling the substrate, a processing time for baking the substrate and a processing time for developing the photoresist layer;

analyzing at least one second processing parameter of a scanner for processing the substrate, thereby yielding at least one second throughput rate of the second apparatus, wherein the second parameter comprises at least one of a range of overlay, a range of focus and a range of energy, wherein the step of analyzing the second processing parameter second includes:

comparing, at least two of a first scan speed corresponding to the range of overlay, a second scan speed corresponding to the range of focus and a third scan speed corresponding to the range of energy, selectin minimum value from the first scan speed, the second scan speed and the third scan speed, analyzing the minimum value, thereby yielding a processing time of the scanner, and dividing a time period by the processing time of the scanner, thereby yielding the second throughput rate;

comparing the first throughput rate and the second throughput rate, thereby yielding at least one comparison result for processing the substrate;

adjusting the at least one second processing parameter of the scanner if the at least one first throughput rate is substantially different from the at least one second throughput rate; and forming semiconductor structures on a substrate in accordance with the at least one first processing parameter of the track and the adjusted second processing parameter of the scanner.

2. The method of claim 1, wherein the step of analyzing the first processing parameter comprises:

adding the at least one of the processing time for forming the adhesive layer over the substrate, the processing time for forming the photoresist layer over the substrate, the processing time for cooling the substrate and the processing time for baking the substrate, thereby yielding a maximum processing time; and dividing a time period by the maximum processing time, thereby yielding the first throughput rate.

3. The method of claim 1,
wherein if the first throughput rate is substantially different from the second throughput rate, the method further comprises adjusting the at least one first throughput rate; and
wherein if the first throughput rate is substantially equal to the second throughput rate, the method further comprises processing the substrate with the first processing parameter and the second processing parameter.

4. The method of claim 3, wherein the step of adjusting the maximum processing time comprises adjusting the processing time for cooling the substrate in the first apparatus.

5. A system for processing substrates for forming semiconductor structures thereon, comprising:
a track configured to process the substrate in accordance with at least one first processing parameter;
a scanner configured to process the substrate in accordance with at least one second processing parameter, wherein the second processing parameter comprises at least one of a range of overlay, a range of focus and a range of energy;
a processor coupled to the first apparatus and the second apparatus, the processor being configured to
analyze the first processing parameter, thereby yielding at least one first throughput rate of the first apparatus;
compare at least two of a first scan speed corresponding to the range of overlay, a second scan, speed corresponding to the range of focus, and a third scan speed corresponding to the range of energy;
select a minimum value from the first scan speed, the second scan speed, and the third scan speed:
analyze the minimum value, thereby yielding a processing time of the scanner, and
divide a time period by the processing time of the scanner, thereby yielding a second throughput rate;
compare the first throughput rate and the second throughput rate, thereby yielding at least one comparison result for processing the substrate; and
adjust the at least one second processing parameter of the scanner if the at least one first throughput rate is substantially different from the at least one second throughput rate.

6. The system of claim 5, further comprising a storage medium coupled to the processor, the storage medium being configured to store at least one of the first processing parameter, the first throughput rate, the second processing parameter, the second throughput rate and the comparison result.

7. The system of claim 5, wherein the first processing parameter comprises at least one of a processing time for forming an adhesive layer over the substrate, a processing time for forming a photoresist layer over the substrate, a processing time for cooling the substrate, a processing time for baking the substrate and a processing time for developing the photoresist layer.

8. A method for processing substrates to manufacture semiconductor structures thereon, comprising:
analyzing at least one first processing parameter of a track for processing a substrate, thereby yielding at least one first throughput rate of the track;
analyzing at least one second processing parameter of a scanner for processing the substrate, thereby yielding at least one second throughput rate of the scanner, the second parameter including at least one of a range of overlay, a range of focus and a range of energy associated with a pattern quality, the analyzing including:
comparing at least two of a first scan speed corresponding to the range of overlay, a second scan speed corresponding to the range of focus and a third scan speed corresponding to the range of energy,
selecting a minimum value from the first scan speed, the second scan speed and the third scan speed,
analyzing the minimum value, thereby yielding a processing time of the second apparatus, and
dividing a time period by the processing time of the second apparatus, thereby yielding the second throughput rate;
comparing the first throughput rate and the second throughput rate, thereby yielding at least one comparison result for processing the substrate; and
forming semiconductor structures on a substrate in accordance with the at least one first processing parameter of the track and the at least one second processing parameter of the scanner.

9. The method of claim 8, wherein the first processing parameter comprises at least one of a processing time for forming an adhesive layer over the substrate, a processing time for forming a photoresist layer over the substrate, a processing time for cooling the substrate, a processing time for baking the substrate and a processing time for developing the photoresist layer.

10. The method of claim 9, wherein the step of analyzing the first processing parameter comprises:
adding the respective processing times of the first processing parameter thereby yielding a maximum processing time; and
dividing a time period by the maximum processing time, thereby yielding the first throughput rate.

11. The method of claim 8,
wherein if the first throughput rate is substantially different from the second throughput rate, the method further comprises adjusting the first throughput rate for processing the substrate; and
wherein if the first throughput rate is substantially equal to the second throughput rate, the method further comprises processing the substrate with the first processing parameter and the second processing parameter.

12. The method of claim 11, wherein the step of adjusting the first throughput rate comprises adjusting a processing time of the track.

13. The method of claim 12, wherein the step of adjusting the processing time of the track comprises adjusting a processing time for cooling the substrate in the track.

14. The method of claim 11, wherein the step of adjusting the second throughput rate comprises adjusting a scan speed of the scanner.

* * * * *

UNITED STATES PATENT AND TRADEMARK OFFICE
CERTIFICATE OF CORRECTION

PATENT NO. : 7,787,977 B2 Page 1 of 1
APPLICATION NO. : 11/563947
DATED : August 31, 2010
INVENTOR(S) : Chien-Hsun Lin et al.

It is certified that error appears in the above-identified patent and that said Letters Patent is hereby corrected as shown below:

Column 10, Claim 1, Line 38, after the word "parameter" delete the word "second".

Column 10, Claim 1, Line 39, delete the "," after the word "comparing".

Column 10, Claim 1, Line 43, delete the word "selectin" and add -- selecting a -- therefor.

Signed and Sealed this

Twenty-first Day of December, 2010

David J. Kappos
*Director of the United States Patent and Trademark Office*